United States Patent [19]

Russell

[11] Patent Number: 5,231,305

[45] Date of Patent: Jul. 27, 1993

[54] CERAMIC BONDING BRIDGE

[75] Inventor: Ernest J. Russell, Richmond, Tex.

[73] Assignee: Texas Instruments Incorporated, Dallas, Tex.

[21] Appl. No.: 495,663

[22] Filed: Mar. 19, 1990

[51] Int. Cl.⁵ .................. H01L 23/48; H01L 29/46; H01L 29/54; H01L 29/62
[52] U.S. Cl. .................. 257/701; 257/678; 257/703; 257/734; 257/700
[58] Field of Search .................. 357/70, 71, 80, 74, 357/76, 69

[56] References Cited

U.S. PATENT DOCUMENTS

| | | | |
|---|---|---|---|
| 4,754,317 | 6/1988 | Comstock et al. | 357/70 |
| 4,862,245 | 8/1989 | Pashby et al. | 357/80 |
| 4,985,748 | 1/1991 | Belanger, Jr. | 357/69 |
| 4,985,753 | 1/1991 | Fujioka et al. | 357/74 |

Primary Examiner—Andrew J. James
Assistant Examiner—Carl Whitehead, Jr.
Attorney, Agent, or Firm—Richard L. Donaldson

[57] ABSTRACT

A ceramic semiconductor package has a ceramic bridge to provide shorter bond wire lengths and other interconnections for the semiconductor device.

18 Claims, 6 Drawing Sheets

CERAMIC BONDING BRIDGE

FIELD OF THE INVENTION

The invention relates to mounting devices for semiconductor devices, and more particularly to a semiconductor ceramic package with a bonding bridge to permit the use of shorter wire lengths in connecting the semiconductor device to the external leads of the mounting package.

BACKGROUND OF THE INVENTION

The use of intermediate bonding pads in semiconductor packages are disclosed in U.S. Pat. No. 4,754,317. In this patent, a semiconductor device is mounted on a lead frame mounting base and a plurality of connecting pads are also mounted on the mounting base around the periphery of the semiconductor device on an insulating material. Bond wires are connecting between the bond pads on the semiconductor device and bond pads on the insulating material on the semiconductor base on the header. Bond wires are then connected between the bond pads on the mounting base of the header to the header lead fingers. By breaking the connecting wires into two parts, the span for each connecting wire is limited.

The design of some semiconductor devices mounted in ceramic packages is such that a single row of centrally located bond pads is used. If the semiconductor die is such that the die width is greater than 200 mils, the wire lengths necessary to connected the centrally located bond pad on the semiconductor die is greater than 100 mils. The design used in metal headers is not applicable to ceramic packages since there is no room in the ceramic package for placing an intermediate bonding pads around the semiconductor device. If there were sufficient room for such intermediate bond pads around the periphery of the semiconductor device, the ceramic package would have to be larger than desirable.

SUMMARY OF THE INVENTION

The invention is to a ceramic package for a semiconductor device including a bonding bridge. The semiconductor device is mounted into a cavity of a ceramic package. A bonding bridge is positioned over the semiconductor device, and, in one embodiment, is attached to the surface of the semiconductor device with an adhesive material or adhesive tape. The bonding bridge has a central opening extending a length that is somewhat shorter tha the length of the semiconductor device. Centrally located bonding pads on the semiconductor device are located in the centrally located opening of the bonding bridge. Bond wires are connected to the bond pads on the semiconductor device and extend up through the central opening in the bonding bridge and are connected to bond pads on the bonding bridge. Wires then may be connected to the bonding bridge bond pads and external connections on the ceramic package. Metalized interconnection circuitry may be formed on the surface of the bonding bridge, or may be formed internal to the bonding bridge to provide interconnections between the semiconductor bonding pads or to form ground and power busses.

In another embodiment of the invention, the bonding bridge may be mounted in a recess of the ceramic package above the semiconductor device and have metalized mounting pads secured to metalization on the bottom of the recess, which metalization may be connected to the external leads of the ceramic package.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
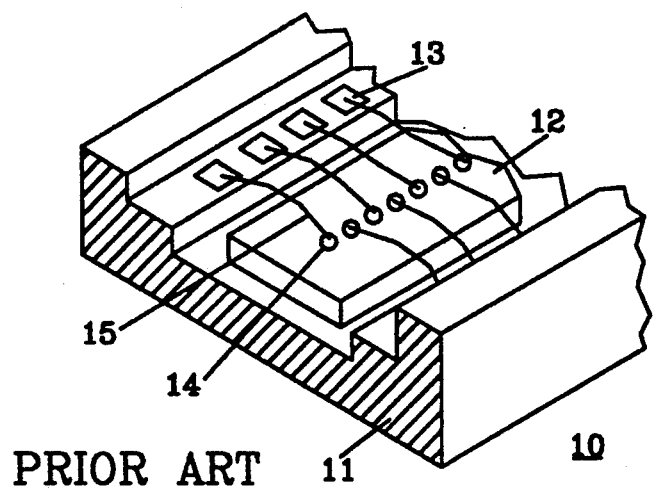
FIG. 1 illustrates an example of a prior art device and package.

FIG. 1 illustrates an example of a prior art device. Device 10 has a ceramic package 11 with a semiconductor device 12 mounted thereon. Centrally located contact pads 14 are connected to contact pads 13 by wires 15. If the semiconductor die is such that the die width is greater than 200 mils, the wire lengths necessary to connected the centrally located bond pad on the semiconductor die is greater than 100 mils. Long wire lengths can sag causing shorts on the semiconductor device, and generally are not desirable.

Figure 2:
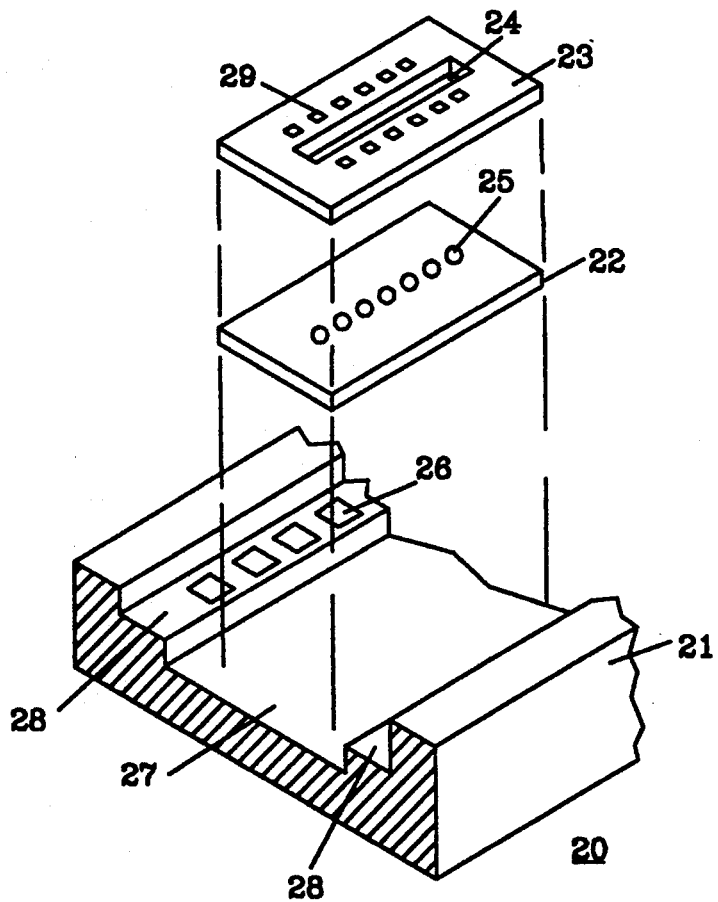
FIG. 2, is an exploded view of one embodiment of the present invention.

FIG. 2 illustrates an exploded view of a partial device. Device 20 has a ceramic package 21 with a central recess 27 on which semiconductor device 22 is mounted. At least two edges of the recess 27 have ledges 28 on which are formed contact pads 26. A bond bridge 23 with a central opening 24 is placed over semiconductor device 22 such that the contact pads 25 on semiconductor device 22 are available through opening 24. After the bond bridge 23 is place over semiconductor device 22, contact pads on semiconductor device 22 are connected to bridge bond pads 29, which are connected to package bond pads 26, as herein after described.

Figure 3:
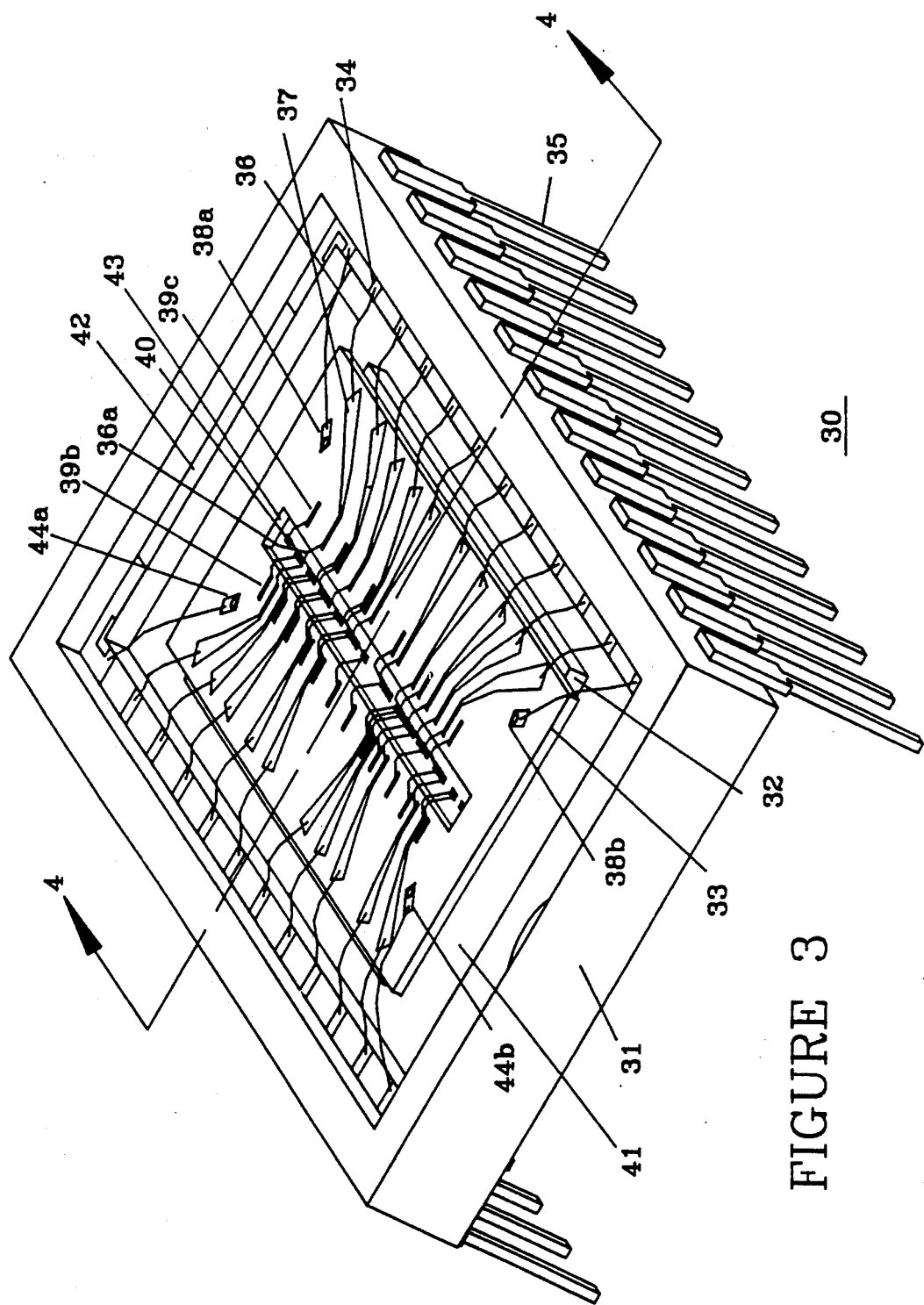
FIG. 3 is an isometric view of the present invention.

FIG. 3 is an isometric view of a packaged semiconductor device using a bonding bridge with metalized interconnections thereon. Device 30 includes a ceramic package 31 having a recess 41 therein in which a semiconductor device 32 is mounted. Around the periphery of recess 41 is a ledge 42 having a plurality of metalized bond pads 34 formed thereon.

Figure 4:
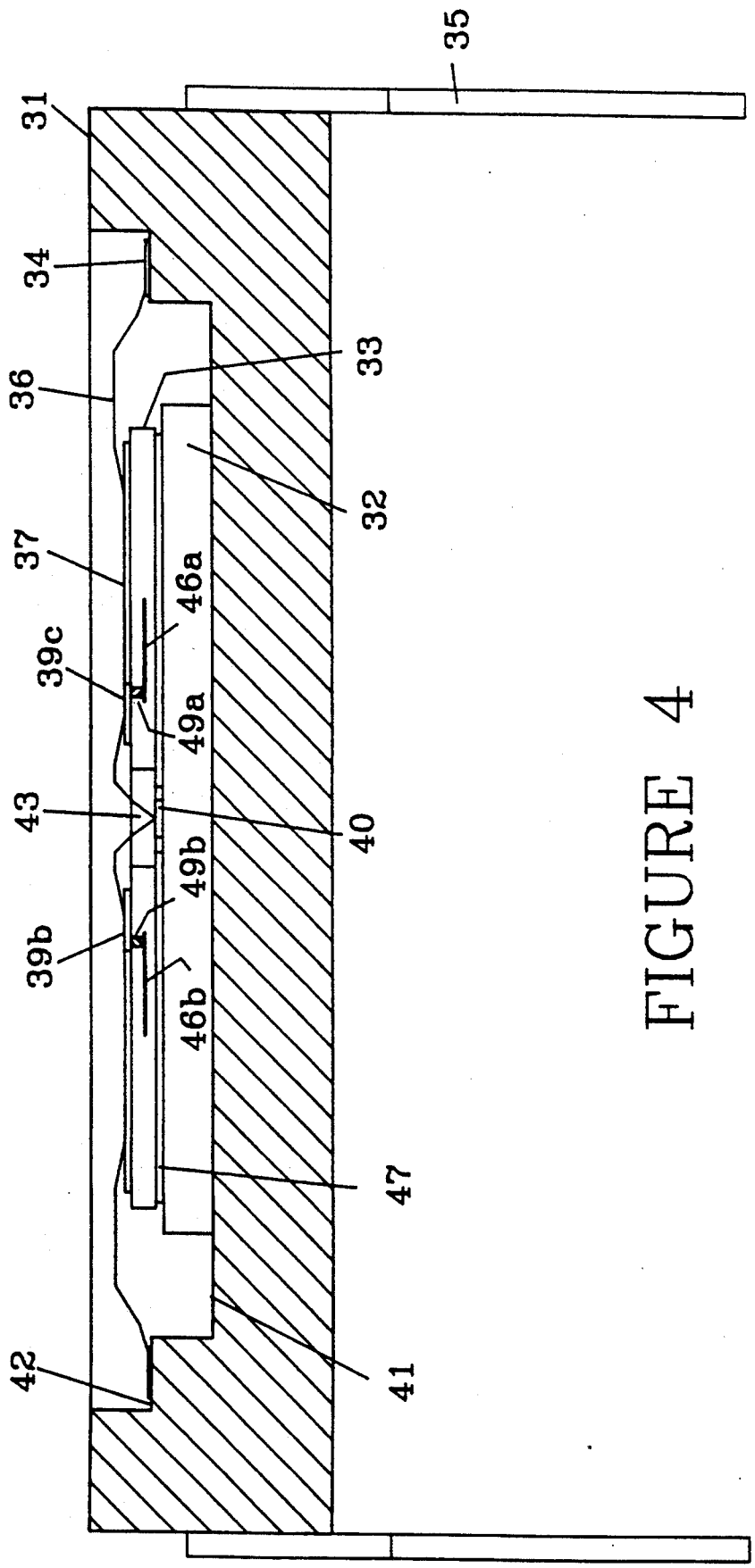
FIG. 4 is a cross-sectional view of one embodiment of the invention.
Figure 5:
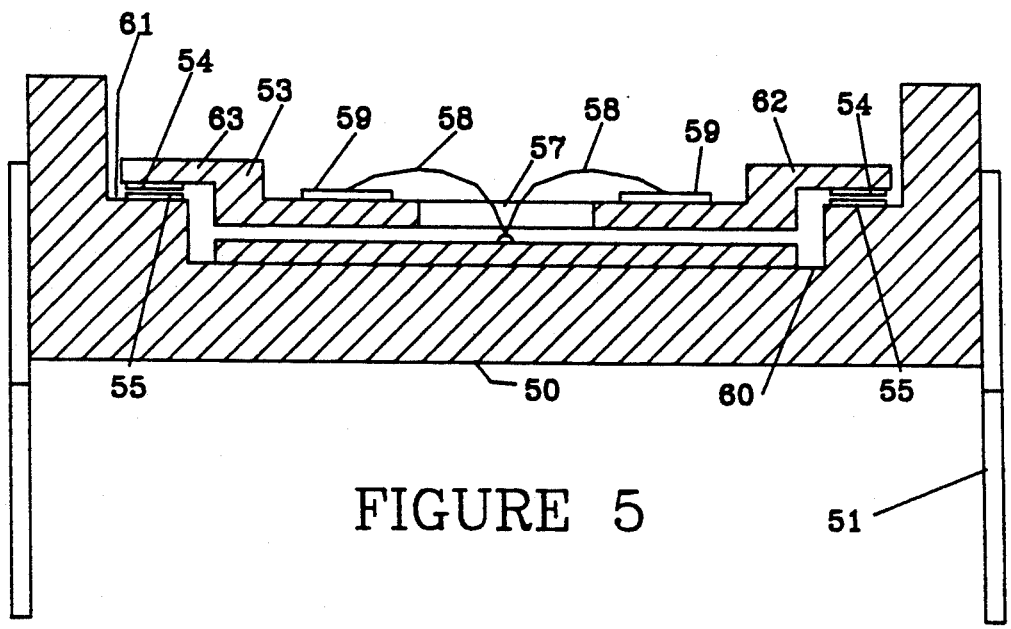
FIG. 5 is a cross-sectional view of another embodiment of the invention.

Mounted over semiconductor device 32 is a bond bridge 33. Bond bridge may be mounted directly on the semiconductor device 32 or spaced above it as illustrated in FIGS. 4 and 5, described below. Bond bridge 33 has metalized patterns thereon which are used to interconnect the semiconductor device 32 with bond pads 34 on ledge 42, which in turn are connected to the external pins 35.

Bond bridge 33 has metalized areas, for example, 37 which are a plurality of metalized areas extending from near the central opening 43 in bond bridge 33 to the edges of the bond bridge near the bond pads 34 on ledge 42. Very short bond wires 36a connect the bond pads 40 on semiconductor device 32 to the metalized patterns 37. A second plurality of bond wires 36 connect the metalized patterns 37 to the bond pads 34.

Other metalized patterns may be formed on the bond bridge 33 to make interconnections between certain bond pads 40 on the semiconductor device. Also metalized areas may extend from one end of the bond bridge 33 to other areas of the bond bridge to distribute power or to form ground busses. For example, Metalized patterns 38a and 38b may be connected together by a metalized buss that is on the under side of the bond bridge or embedded within the bond bridge.

The buss, illustrated in FIGS. 4 and 7 and discussed below, may be used to distribute power as needed to various bond pads 40 on the semiconductor device. Metalized areas may be connected by a buss and serve as a ground buss. A series of short metalized patterns 39a extending along one side of central opening 43 in bond bridge 33 may be connected to the buss extending between metalized areas 38a and 38b by plated openings extending from under the metalized areas 39a to the buss. Similarly, the plurality of metalized areas 39b may be connected to the ground buss between metalized areas 44a and 44b.

FIG. 4 is a cross-sectional view of the device and package of FIG. 3. Package 31 has a recess 41 in which semiconductor device 32 is mounted. Bond bridge 33 is mounted on semiconductor device 32 with an insulating adhesive or tape 47.

Opening 43 in bond bridge 33 permits bond wires 36a connected bond pads 40 on the semiconductor device 32 to be connected to metalized contact 39c or 37. Wire 36 connects the metalized conductor 37 to bond pad 34 on ledge 42.

Two buss conductors 46a and 46b are embedded in bond bridge 33 and extend parallel to the central opening 43. The short metalized areas 39a and 39b are connected to respective busses 46a and 46b by metalized vias extending from the buss to the surface, and connected to the surface metalization. The busses 46a and 46b may be on the under side of the bond bridge as long they are insulated from the surface of the semiconductor device 32.

FIG. 5 illustrates another embodiment of the invention wherein the bond bridge is not attached directly to the semiconductor device, but is positioned over the semiconductor device. The ceramic package 50 has a recess 60 therein in which the semiconductor device 52 is mounted. Package 50 has a ledge 61 that is on at least two sides of recess 60. A bond bridge 53 has off-set mounting edges 62 and 63 which extend over the ledge 61. Ledge 61 has a plurality of metalized bond pads 55 extending along the ledge, each bond pad 55 is electrically separated from the other bond pads 55. There are as many bond pads 55 as there are package mounting pins 51. The bond pads are electrically connected (not illustrated) to the mounting pins 51 by metalized patterns extending from bond pads 55 through the package 50.

Bond bridge 53 is spaced above the semiconductor device a distance to insure that is no electrical contact between the bond bridge 53 and semiconductor device 52. The centrally located bond pads 56 on semiconductor device 52 are located under the opening 57 in bond bridge 53. Bond wires 58 attached to the bond pads 56 extend up through opening 57 and are attached to bond pads 59 on the bond bridge 53. Metalization (not illustrated) interconnects the bond pads with metal interconnections 54 to interconnect with the device pins 51.

Figure 6:
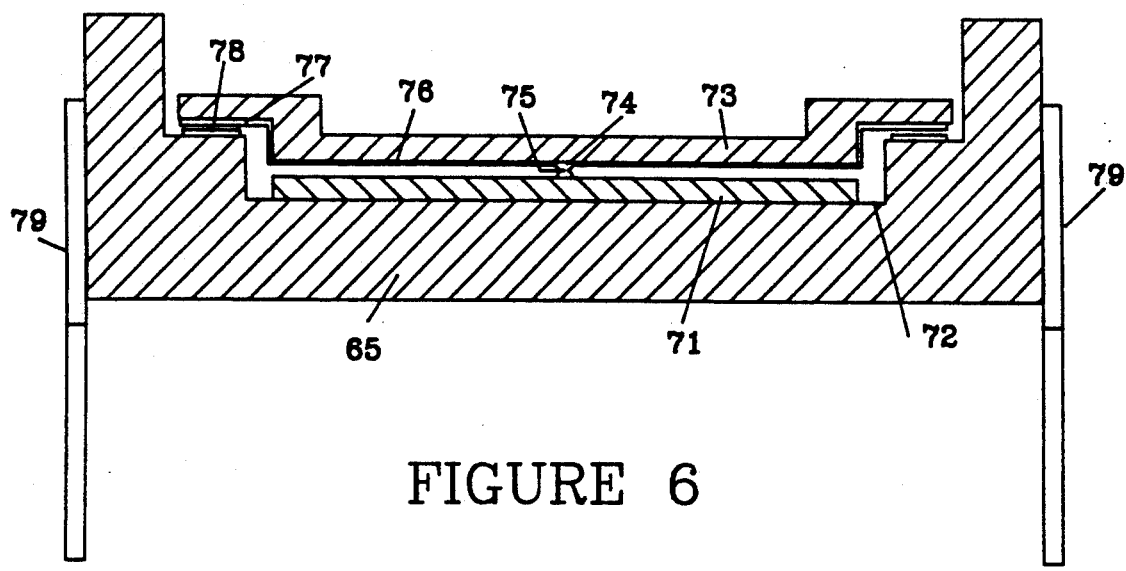
FIG. 6 is a cross-sectional view of still another embodiment of the invention.

FIG. 6 is another embodiment of the invention. Package 65 has a recess 72 into which the semiconductor device 71 resides. Bond bridge 73 has a plurality of bond pads 74 that align with and are in contact with the bond pads 75 on the semiconductor device 71. Conductors 76 extend from the bond pads 74 to the edge of the bond bridge 73 forming a contact 77 which is electrically connected to a contact 78 when the bond bridge is in place. Contact 78 is connected (not illustrated) to the pins 79 on the side of the package 65. The use of the bond bridge described in reference to FIG. 6 eliminates the need for bond wires by using metalized conductors and contacts on the bond bridge to interconnect the bond pads 75 on the semiconductor device, provide power and ground busses, and connect the semiconductor to the package pins 79.

Figure 7:
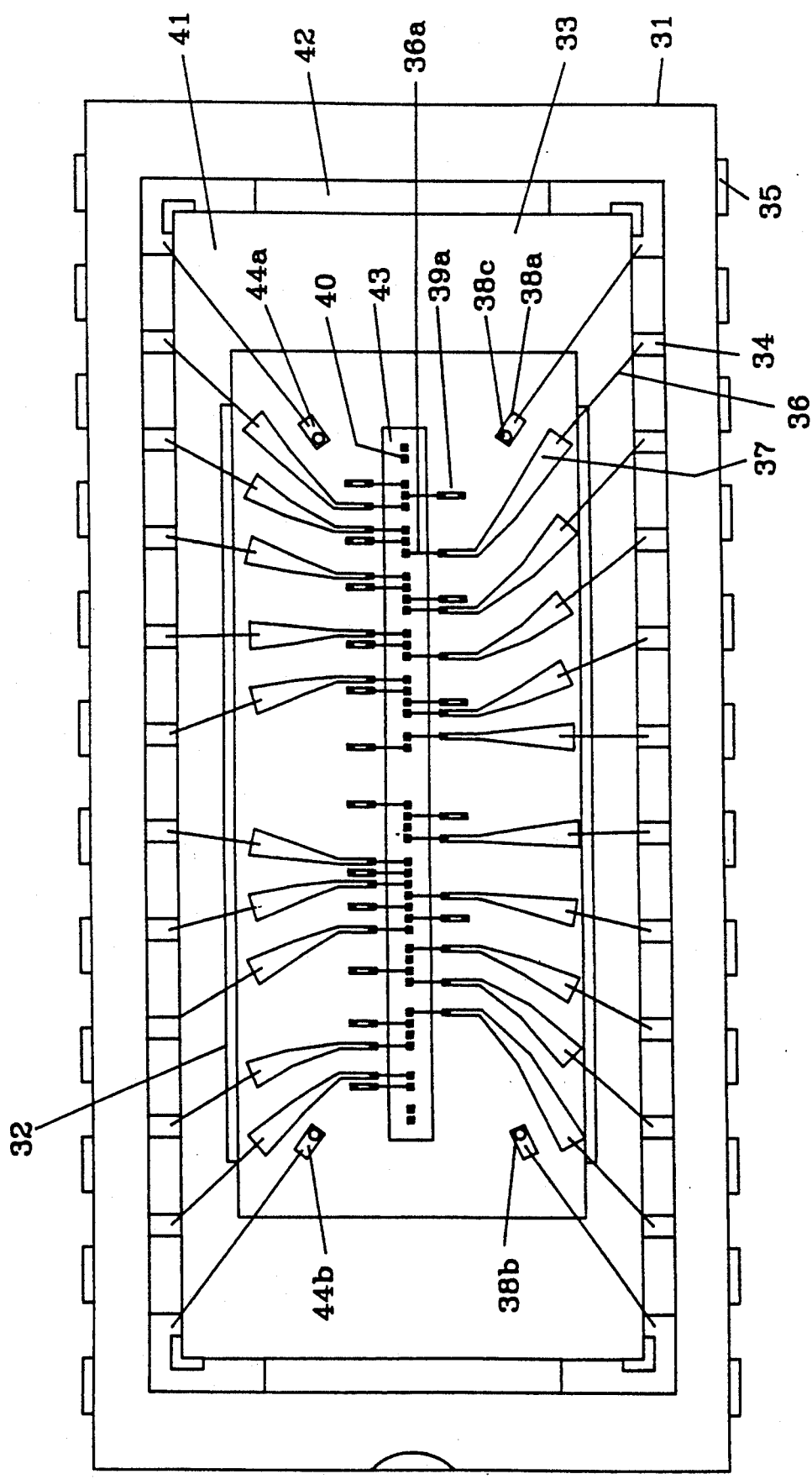
FIG. 7 is a top view of the device illustrated in FIG. 3.

FIG. 7 is a top view of the packaged semiconductor device of FIG. 3 using a bonding bridge with metalized interconnections thereon. The semiconductor device includes a ceramic package 31 having a recess 41 therein in which a semiconductor device 32 is mounted. Around the periphery of recess 41 is a ledge 42 having a plurality of metalized bond pads 34 formed thereon.

Mounted over semiconductor device 32 is a bond bridge 33. Bond bridge is mounted directly on the semiconductor device 32. Bound bridge 33 has metalized patterns thereon which are used to interconnect the semiconductor device 32 with bond pads 34 on ledge 42, which in turn are connected to the external pins 35.

Bond bridge 33 has metalized areas, for example, 37 which are a plurality of metalized areas extending from near the central opening 43 in bond bridge 33 to the edges of the bond bridge near the bond pads 34 on ledge 42. Very short bond wires 36a connect the bond pads 40 on semiconductor device 32 to the metalized patterns 37. A second plurality of bond wires 36 connect the metalized patterns 37 to the bond pads 34. There is an interconnection 38c on metalized area 38a which goes into the bond bridge 31 to connected to an embedded buss. There are similar interconnection of the other metalized areas 38b, 44a, 44b and the metalized contact areas 39a.

Figure 8:
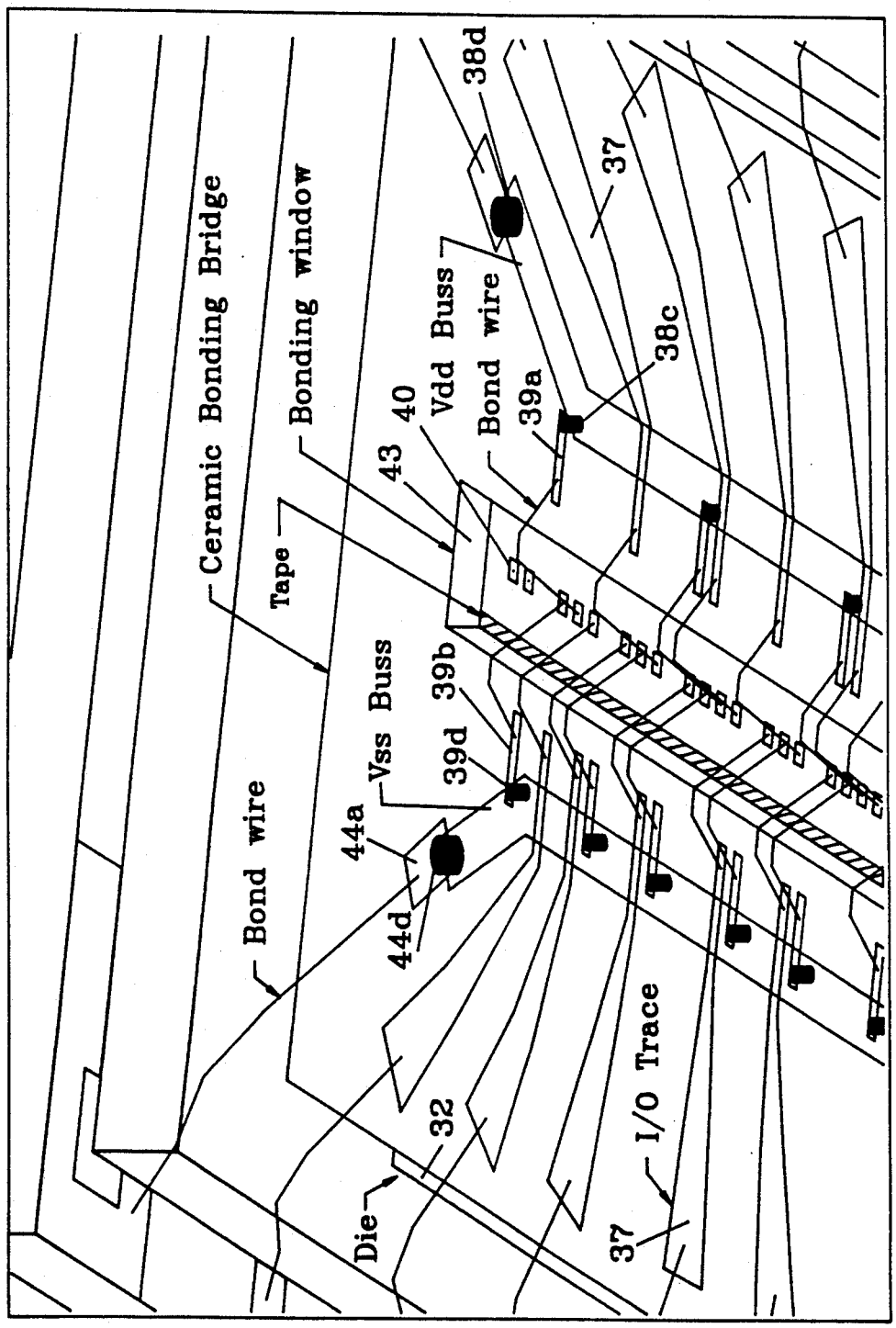
FIG. 8 is an enlarged portion of the isometric view of FIG. 3.

FIG. 8 is a partial view of FIG. 3 showing the detail of the interconnections and illustrating the buss and buss interconnections. The Vdd Buss is connected to the contact areas 38a by interconnections 39a, and the Vs buss is connected to the contact area 44a by interconnection 44d. Contacts 39b connect to the Vss buss by interconnections 39d.

What is claimed is:

1. A ceramic ackage assembly for a semiconductor device, including a bridge for connecting the semiconductor device to external pins on the ceramic package, comprising:

a ceramic package having external lead ppins connected to internal bond pads in the package;

a semiconductor device having bond pads thereon;

a ceramic bridge having bond pads theron, positioned over the semiconductor device, the ceramic bridge bond pads directly connecting the bod pads on the semiconductor device, and the bond pads on teh ceramic bridge are connected to the internal bond pads in the package, and and metalized conductorpatterns on the ceramic bridge connecting the bondpads on the cermic bridge positioned over the semiconductor device tot eh bond pads on the ceramic bridge connected to the internal bond pads in the package.

2. The ceramic package assembly according to claim 1, wherein the ceramic bridge has a central opening through which the bond pads on the semiconductor device are connected to the bond pads on the ceramic bridge.

3. The ceramic package assembly according to claim 1, including buss conductors on the ceramic bridge extending a portion of the length of the bridge.

4. The ceramic package assembly according to claim 1, wherein the ceramic bridge is attached to the top of the semiconductor device by an adhesive.

5. The ceramic package assembly according to claim 1, where in the ceramic bridge is spaced above the semiconductor.

6. The ceramic package assembly according to claim 3, wherein the buss connectors are embedded in the ceramic bridge.

7. The ceramic package assembly according to claim 1, wherein the ceramic package has a recess therein in which the semiconductor device is mounted, and the ceramic bridge is mounted directly on the semiconductor device.

8. The ceramic package assembly according to claim 1, wherein the ceramic package has at least two ledges extending above the semiconductor device, and the ceramic bridge is mounted on the ledge spaced above the semiconductor device.

9. The ceramic package assembly according to claim 1, wherein the ceramic bridge has metalized conductors on and within the body of the bridge, and conductors extending from the metalized conductors tothe conductors within the body of the ceramic bridge.

10. A ceramic package assembly for a semiconductor device, including a bridge for connecting the semiconductor device to external pins on the ceramic package, comprising:

a ceramic package having external lead pins connected to internal bond pads in the package;

a semiconductor device having bond pads thereon; and a ceramic bridge, positioned over the semiconductor device, having metalized patterns thereon;

contact pads on the ceramic bridge connected to the metalized patterns; and contact pads on the ceramic bridge directly connected to the bond pads ont eh semiconductor device and directly connected to the internal bond pads in the package;

the metalized patterns on the ceramic bridge also connected to other metalized conductors in the ceramic package.

11. The ceramic package assembly according to claim 10, wherein the ceramic bridge has a central opening through which the bond pads on the semiconductor device are connected to the bond pads on the ceramic bridge.

12. The ceramic package assembly according to claim 10, including buss conductors on the ceramic bridge extending a portion of the length of the bridge.

13. The ceramic package assembly according to claim 10, wherein the ceramic bridge is attached to the top of the semiconductor device by an adhesive.

14. The ceramic package assembly according to claim 10, wherein the ceramic bridge is spaced above the semiconductor.

15. The ceramic package assembly according to claim 12, wherein the buss connectors are embedded in the body of the ceramic bridge.

16. The ceramic package assembly according to claim 10, wherein the ceramic package has a recess therein in which the semiconductor device is mounted and the ceramic bridge is mounted directly on the semiconductor device.

17. The ceramic package assembly according to claim 10, wherein the ceramic package has at least two ledges extending above the semiconductor device, and the ceramic bridge is mounted on the ledge spaced above the semiconductor device.

18. The ceramic package assembly according to claim 10, wherein the ceramic bridge has metalized conductors on and within the body of the bridge, and conductors extending from the metalized conductors to the conductors within the body of the ceramic bridge.

* * * * *